United States Patent [19]

Hara et al.

[11] Patent Number: 4,795,895
[45] Date of Patent: Jan. 3, 1989

[54] MULTI-LAYERED ELECTRONIC CARD CARRYING INTEGRATED CIRCUIT PELLET AND HAVING TWO-PAD LAYERED STRUCTURE FOR ELECTRICAL CONNECTION THERETO

[75] Inventors: Kazuya Hara; Kenji Rikuna, both of Tokyo, Japan

[73] Assignee: Casio Computer Co., Ltd., Tokyo, Japan

[21] Appl. No.: 881,221

[22] Filed: Jul. 2, 1986

[30] Foreign Application Priority Data

Jul. 10, 1985 [JP] Japan .................................. 60-151779

[51] Int. Cl.⁴ ........................ G06K 19/06; B42D 15/00
[52] U.S. Cl. .................... 235/492; 235/488; 283/904
[58] Field of Search ............. 235/492, 487, 488, 441, 235/380; 283/904; 361/397, 399, 400, 403, 398

[56] References Cited

U.S. PATENT DOCUMENTS

| | | | |
|---|---|---|---|
| 3,702,464 | 11/1972 | Castrucci | 235/492 |
| 3,887,783 | 6/1975 | Comette . | |
| 4,222,516 | 9/1980 | Badet et al. | 235/492 |
| 4,380,699 | 4/1983 | Monnier et al. | 235/492 |
| 4,417,413 | 11/1983 | Hoppe et al. | 235/488 X |
| 4,532,419 | 7/1985 | Takeda | 235/492 |
| 4,552,383 | 11/1985 | Hoppe et al. | 235/488 |
| 4,621,190 | 11/1986 | Saito et al. | 235/492 |
| 4,727,246 | 2/1988 | Hara et al. | 235/488 |
| 4,731,645 | 3/1988 | Parmentier et al. | 235/441 X |

*Primary Examiner*—Philip H. Leung
*Attorney, Agent, or Firm*—Frishauf, Holtz, Goodman & Woodward

[57] ABSTRACT

In an electronic memory card an IC pellet has a number of electrode pads which are provided on one surface thereof and have a size larger than that of bonding terminals formed in the IC pellet. The IC pellet is received in a storage section of an upper inner core and is adhered on a wiring substrate by an anisotropic conductive adhesive tape. Thus, internal connecting terminals formed on the substrate are electrically connected through portions of the conductive tape to the electrode pads. The wiring substrate is mounted on a lower inner core and is received in a storage section of an intermediate inner core. Films are formed on the multi film structure of the inner core and wiring substrate and contact terminals are so provided in the film and inner core as to be connected to the internal connecting terminals.

5 Claims, 6 Drawing Sheets

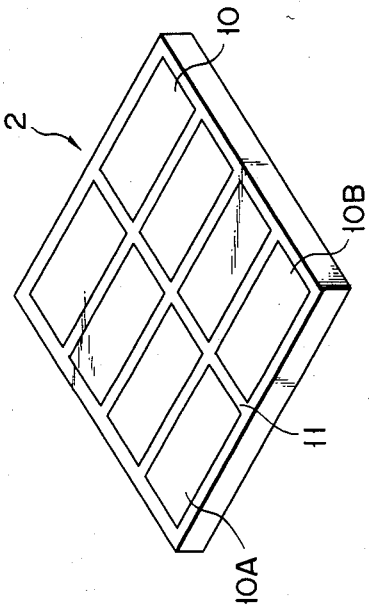
F I G. 3
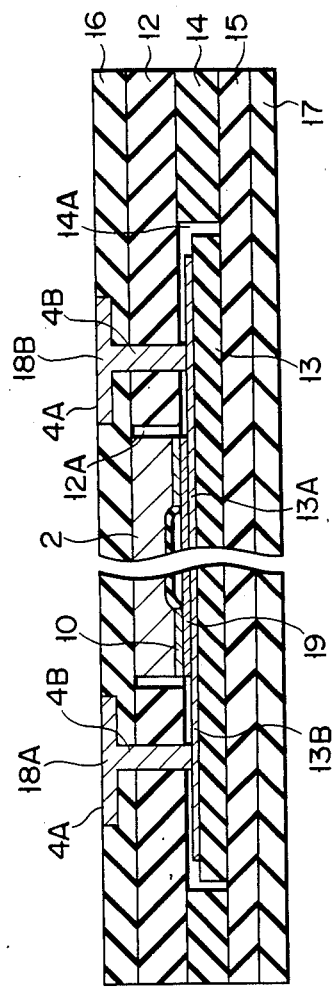
F I G. 4

MULTI-LAYERED ELECTRONIC CARD CARRYING INTEGRATED CIRCUIT PELLET AND HAVING TWO-PAD LAYERED STRUCTURE FOR ELECTRICAL CONNECTION THERETO

BACKGROUND OF THE INVENTION

The present invention relates to an electronic memory card which is used as a credit card, an identification card, and the like, and incorporates an integrated circuit pellet (e.g., an IC, LSI, or the like).

An electronic memory card incorporating an integrated circuit pellet (e.g., an IC, an LSI, or the like) has been recently developed. When the integrated circuit pellet is adhered to a substrate inside the electronic memory card by an adhesive, since the integrated circuit pellet is small, it is difficult to precisely and reliably mount the electrodes of the pellet on the connecting terminals of the substrate due to technical limitations. For example, the electrodes of the pellet may not be reliably and satisfactorily mounted on the connecting terminals of the substrate, thus impairing the reliability of the electrical connection therebetween. between.

U.S. Pat. Nos. 3,701,464, 3,887,783, and U.S. Pat. No. 4,222,516 disclose a technique for mounting the electrodes of the pellet on the connecting terminals of the substrate In an information card disclosed in these patents, each conductor of an IC chip is soldered to a corresponding conductor strip. However, during soldering, each conductor of the IC chip is carefully aligned to the corresponding chip, and is then secured thereto. This assembly leads to low productivity of information cards, and is not suitable for mass-production. In this method, an alignment apparatus and a soldering apparatus of very high precision are necessary. In particular, in the information card disclosed in U.S. Pat. No. 4,222,516, a high-precision machining technique is required to form the terminals extending outside the card. The information card of this structure is also unsuitable for mass-production.

SUMMARY OF THE INVENTION

It is an object of the present invention to provide an electronic memory card having a structure which can easily and reliably connect a plurality of contacts of an integrated circuit pellet to an insulating substrate.

It is another object of the present invention to provide an electronic memory card in which each contact of leads of an insulating substrate has a very simple structure.

According to an electronic memory card of the present invention, there is provided a structure for carrying an integrated circuit pellet using carrier means on which a large number of conductive leads are formed, wherein the integrated circuit pellet comprises:

a surface region in which a semiconductor element is formed to have a predetermined circuit configuration;

a large number of electrode terminals provided on the surface region and connected to the semiconductor element;

an insulating layer formed on the surface region and covering the same except in the area of the electrode terminals; and connection pads extending on the insulating layer and connected to the electrode terminals, the size of the connection pads being larger than that of the electrode terminals.

BRIEF DESCRIPTION OF THE DRAWINGS

FIG. 3 is a perspective view showing the semiconductor pellet shown in FIG. 2;

FIG. 4 is a sectional view of the card shown in FIG. 1;

DETAILED DESCRIPTION OF THE PREFERRED EMBODIMENTS

Figure 1:
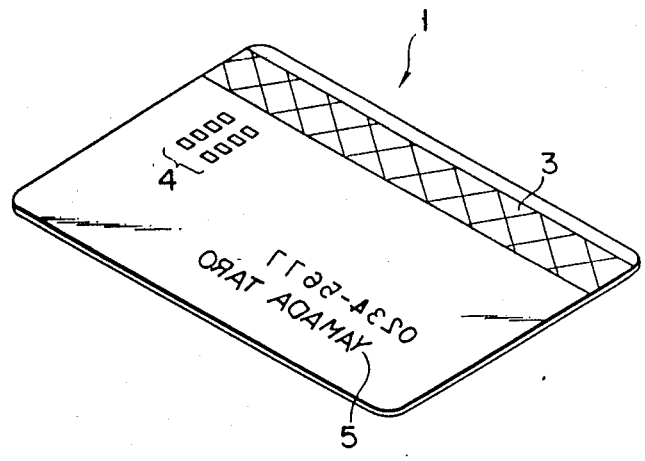
FIG. 1 is a perspective view showing an electronic memory card according to an embodiment of the present invention.
Figure 2:
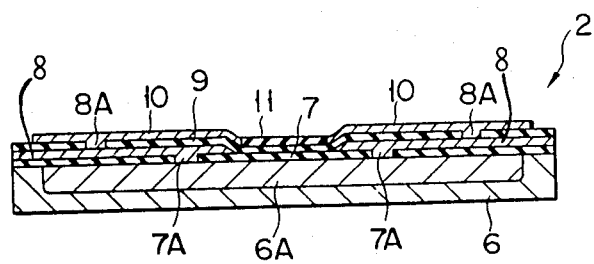
FIG. 2 is a sectional view of a semiconductor pellet incorporated in the card shown in FIG. 1.

FIG. 1 shows an electronic memory card according to an embodiment of the present invention. Electronic memory card 1 has a thickness of about 0.8 mm, and incorporates integrated circuit (IC) pellet 2, as will be described later. Magnetic stripe portion 3 and external connection terminal portion 4 are arranged on the front surface of card 1, and embossed portion 5 is formed on the back surface thereof. Magnetic data (e.g., a verification code of the card) is recorded on magnetic stripe portion 3. Embossed portion 5 is formed by embossing to project from the back surface of card 1 or to be pitted in the front surface, so as to represent identification data (e.g., the name of a card holder, an identification code, and the like). As shown in FIG. 2, in IC pellet 2 of $4 \times 4 \times 0.4$ mm size, a semiconductor element (e.g., a MOS transistor) serving as active region 6A is formed on silicon substrate 6, and insulating layer 7 (e.g., an $SiO_2$ layer), in which through holes 7A are formed at predetermined positions, is formed on active region 6A. Aluminum is formed on insulating layer 7 by a vapour deposition process and is then etched to form an internal wiring pattern and electrode pads 8 to be connected to an external circuit. Insulating layer 9 (e.g., an $SiO_2$ layer) in which through holes 8A are formed at predetermined positions is formed on electrode pads 8. Aluminum is formed on insulating film 9 by a vapour deposition process, and is then etched to form external electrode pads 10 having a size larger than that of pads 8. In contrast with a conventional IC chip, the pellet having the above described structure is not provided with bonding wires and a resin capsule. In this embodiment, as shown in FIG. 3, external electrode pads 10 are aligned on the uppermost surface of pellet 2 in a $4 \times 2$ matrix, and insulating layer 11 (e.g., an $SiO_2$ layer) is arranged between pad 10. Some of electrode pads 10 in the $4 \times 2$ matrix are electrically connected to internal electrode pads 8 through corresponding through holes 8A, and the remaining electrode pads 10, e.g., two lower electrode pads 10A and 10B, are auxiliary pads and are not connected to pads 8.

Figure 5:
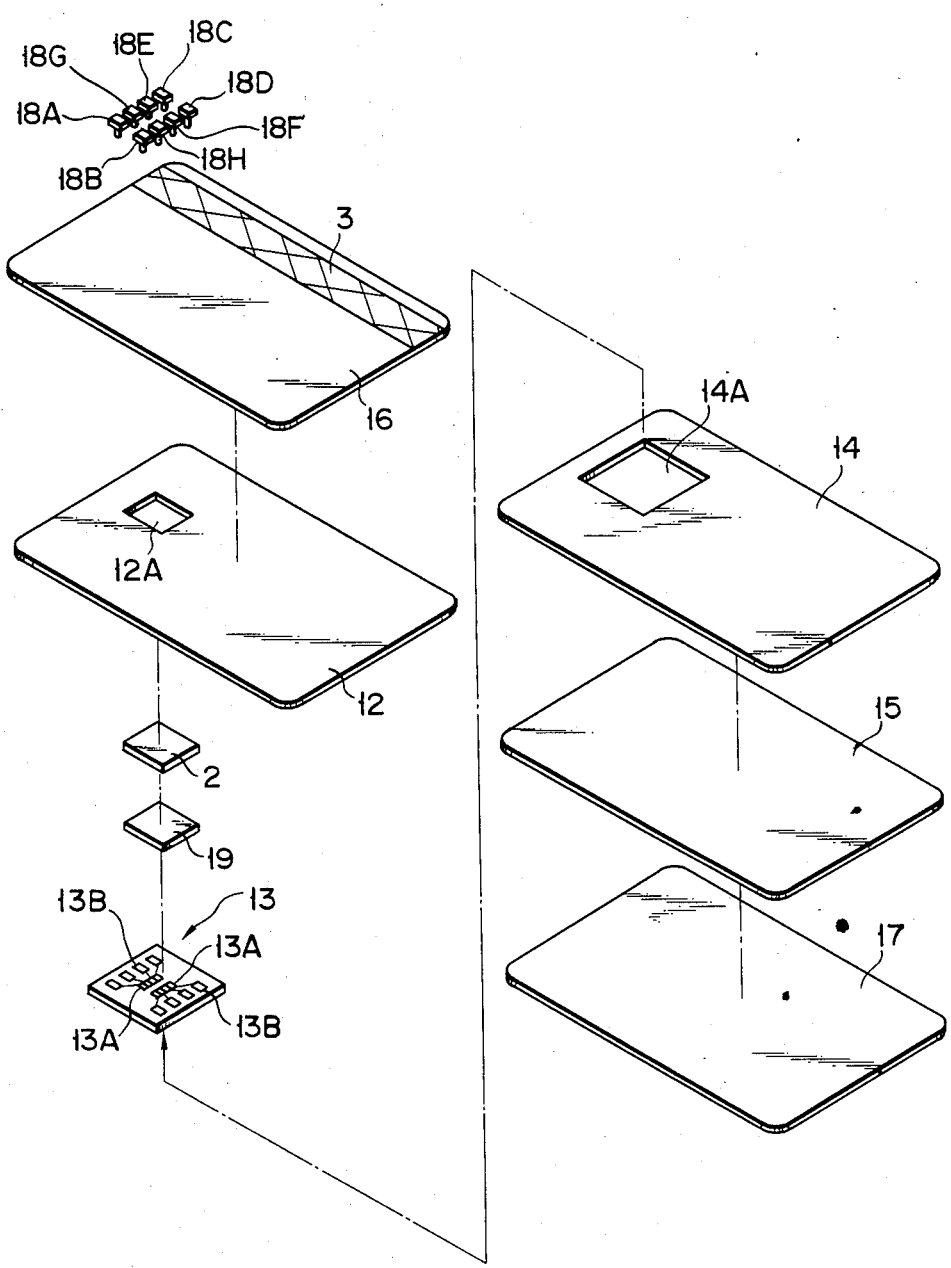
FIG. 5 is an exploded perspective view of the card shown in FIG. 1.

In electronic memory card 1 incorporating IC pellet 2, intermediate inner core 14 for storing wiring substrate 13 is adhered to the lower surface of upper inner core 12 for storing IC pellet 2, and lower inner core 15 is adhered to the lower surface of core 14, as shown in FIG. 4. Upper- and lower-surface films 16 and 17 are laminated on the upper surface of core 12 and the lower surface of core 15, respectively. Films 16 and 17 are formed of a soft resin (e.g., poly-vinyl chloride added with plasticizer), and magnetic stripe portion 3 is formed on the surface of film 16. Inner cores 12, 14, and 15 are formed of a hard resin (e.g., vinyl chloride). Storage portion 12A for storing pellet 2 is formed in inner core 12, and storage portion 14A for storing wiring substrate 13 is formed in inner core 14 to correspond to portion 12A of core 12, as shown in FIG. 5. Wiring substrate 13 arranged in storage portion 14A of core 14 is a film-like sheet, and is slightly larger than pellet 2. Internal connection terminals 13A and external connection terminals 13B are aligned on the upper surface of substrate 13. Internal connection terminals 13A are connected to electrode pads 10 of pellet 2, and external connection terminals 13B are connected to contact terminals 18A, 18B, 18C, . . . , 18H of external connection terminal portion 4. More specifically, IC pellet 2 is adhered onto wiring substrate 13 through anisotropic conductive adhesive tape 19. Thus, internal connection terminals 13A are electrically connected to electrode pads 10 by tape 19. Tape 19 is prepared by mixing conductive particles 13C (e.g., Ni, Al, Carbon, and the like) with hot-melt type insulating adhesive 30. When IC pellet 2 is adhered to the upper surface of substrate 13 through tape 19, electrodes opposing each other through tape 19 are electrically conducted, but adjacent electrodes are not. Contact terminals 18A, 18C, 18D, . . . , 18H of terminal portion 4 connected to external connection terminals 13B of substrate 13 are formed of a conductive metal, and each has flat head portion 4A and projection 4B formed integrally therewith. In the manufacture of electronic memory card 1 with the above structure, a thermocompression bonding tool is brought into contact with head portion 4A of terminals 18A, 18B, 18C, . . . , 18H, and their projections 4B are inserted in upper inner core 12 from above film 16. Next, projections 4B of terminals 18A, 18B, 18C, . . . , 18H heated by the bonding tool partially melt upper inner core 12, and are inserted therein until the lower ends of projections 4B are brought into contact with terminals 13B. Upper film 16 ccorresponding to head portions 4A of terminals 18A, 18B, 18C, . . . , 18H is locally gelled and, thereafter, is bonded to portions 4A after the bonding tool is released. Therefore, terminals 18A, 18B, 18C, . . . , 18H are bonded to film 16 and inner core 12, and electrode pads 10 of IC pellet 2 are electrically connected to terminals 18A, 18B, 18C, . . . , 18H through wiring substrate 13. The upper surfaces of terminals 18A, 18B, 18C, . . . , 18H buried in film 16 are in substantially the same plane as that of the upper surface of film 16, and the upper surface of card 1 is flat. Terminals 18A and 18B of terminals 18A, 18B, 18C, . . . , 18H are auxiliary terminals, and are connected to pads 10A and 10B. Terminal 18C receives reference voltage Vcc, terminal 18D serves as a GND terminal, terminal 18E receives a reset signal, terminal 18F receives a high voltage $V_{pp}$ for writing data, terminal 18G receives a clock signal, and terminal 18H receives address and data signals as input/output signals.

In the electronic memory card of the above structure, each of contact terminals 18A, 18B, 18C, . . . , 18H of terminal portion 4 has a structure wherein each projection 4B extends from the lower surface of flat head portion 4A. Projections 4B are inserted in film 16 from above using a thermo-compression bonding tool to partially gel film 16 and, thereafter, are bonded thereto. Therefore, contact terminals 18A, 18B, 18C, . . . , 18H can be effectively bonded to upper film 16 through a simple operation.

Another embodiment of the present invention will now be described with reference to FIG. 6. The same reference numerals in FIG. 6 denote the same portions as in FIGS. 1 to 5, and a detailed description thereof will be omitted.

Figure 6:
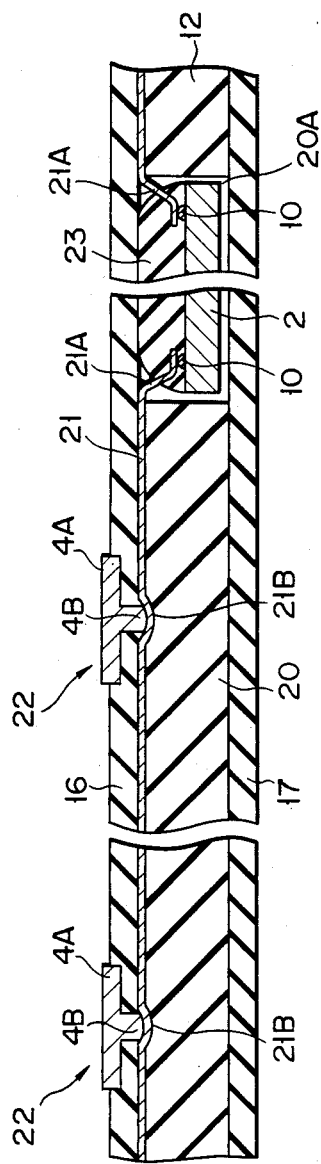
FIG. 6 is a sectional view of an electronic memory card according to another embodiment of the present invention.

In an electronic memory card shown in FIG. 6, wiring pattern 21 is arranged directly on the upper surface of inner core 20 for storing pellet 2. IC pellet 2 and contact terminals 22 are connected to pattern 21. More specifically, inner core 20 is made of a hard resin (e.g., vinyl chloride), and storage portion 20A is formed in a predetermined portion thereof. Wiring pattern 21 formed on inner core 20 is formed by etching a copper foil adhered to the entire surface of inner core 20 except for storage portion 20A. Connection leads 21A formed by extending wiring pattern 21 are connected to external connection pads 10 of IC pellet 2, and external connection terminals 21B are connected to contact terminals 22 of external connection terminal 4. In the electronic memory card shown in FIG. 6, after external connection pads 10 of pellet 2 are connected to the corresponding connection leads 21A of wiring pattern 21, the connecting portions are sealed by mold resin 23 inside storage portion 20A of inner core 20. Each contact terminal 22 of terminal portion 4 has flat head portion 4A and projection 4B extending from the lower surface thereof, as in the first embodiment. Contact terminals 22 are compressed and inserted in upper film 16 from above by a thermo-compression bonding tool to partially gel a portion of film 16, and are then bonded thereto. Therefore, the lower ends of contact terminals 22 are connected to connection terminals 21B of wiring pattern 21. In the electronic memory card of this embodiment, each contact terminal 22 is buried in film 16 so that its upper surface projects slightly from film 16, and is held in film 16 only by its bonding force. Note that upper and lower films 16 and 17 are laminated on the upper and lower surfaces of inner core 20.

The above electronic memory card has a structure suited for mass-production, and has inner core 20 with a simple structure, thus reducing the thickness of the card.

In the previous embodiment, each contact terminal of external connection terminal portion 4 is thermally bonded directly to upper film 16 and upper inner core 2. However, if a guide hole is formed in upper film 16 and upper inner core 12, and an adhesive is interposed between the lower surface of head portion 4A of terminal 22 and upper film 16, each contact terminal can be bonded by simply compressing and inserting it in the guide hole.

Figure 7:
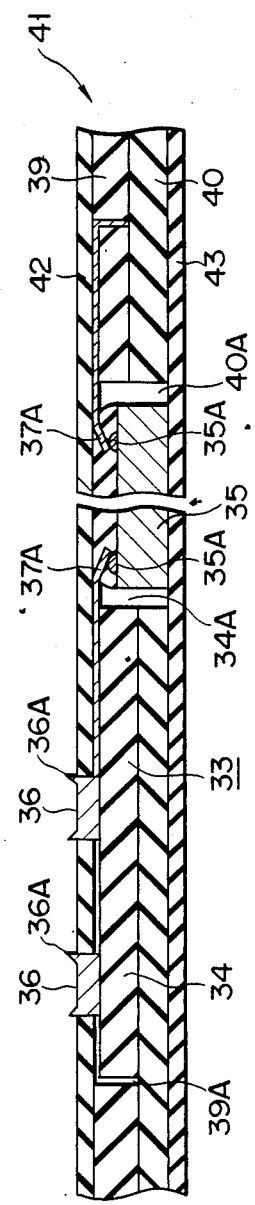
FIG. 7 is a sectional view of another embodiment of the present invention.
Figure 8:
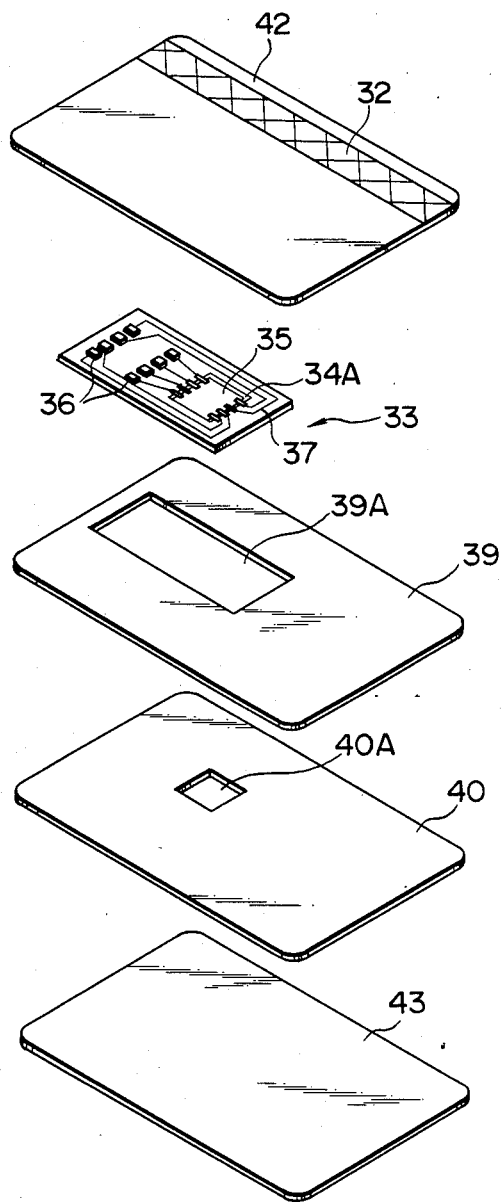
FIG. 8 is an exploded perspective view of the card shown in FIG. 7.

Another embodiment of the present invention will now be described with reference to FIGS. 7 to 9B. In an electronic memory card shown in FIG. 7, wiring substrate 34 is formed on a 300 $\mu$m thick flexible, rectangular plate formed of a hard vinyl chloride resin. Substantially square opening 34A for IC pellet 35 is formed in a region of wiring substrate 34, near the center of the card, as shown in FIG. 8. Eight contact portions 36 in a 2×4 matrix are formed to project in a region of wiring substrate 34, apart from the center of the card, as shown in FIG. 8. The projecting portion of each contact portion 36 has substantially the same rectangular shape as that of an upper overcoat (to be described later), and has sharp edge portion 36A which projects from the upper outer periphery thereof. IC pellet 35 having the structure shown in FIG. 2, thicker than wiring substrate 34, is fitted in opening 34A thereof, and electrodes 35A of pellet 35 are connected to contact portions 36 through conductor lead pattern 37 formed on wiring substrate 34.

Lead pattern 37 is formed such that a copper foil is laminated on wiring substrate 34 and is then etched. Contact portions 36 are formed such that a copper foil is laminated on wiring substrate 34 and, after copper plating is performed on a portion of lead pattern 37 to a predetermined thickness, the resultant structure is etched to form sharp edge portion 36A on the upper surface. Alternatively, each contact portion 36 can be formed without copper plating such that the lower portion of a small copper segment, on which sharp edge portion 36A is formed by pressing, is fitted in and fixed to a hole formed in wiring substrate 34. In order to connect lead pattern 37 and electrodes 35A of IC pellet 35, the lower surface regions of connection portions 37A of lead pattern 37 to be connected to electrodes 35A are tin-plated. Gold bumps are formed on electrodes 35A, which corresponds to tin-plated connection portions 37A. Connection portions 37A of lead pattern 37 and electrodes 35A are connected so that gold and tin are welded by a pulse heating method. A seal resin is formed on IC pellet 35 by partial molding, thereby fixing IC pellet 35 to wiring substrate 34, and buries connection portions 37A of lead pattern 37 and electrodes 35A therewith. As can be seen from FIG. 7, IC pellet 35 is arranged so that its lower portion projects from the lower suface of wiring substrate 34. Upper sheet 39 has a thickness of 300 μm and is formed of a hard resin (e.g., vinyl chloride). Upper sheet 39 has rectangular opening 39A, in which IC module 33 is fitted. Opening 39A is formed in sheet 39 to extend from one short side of the card, along magnetic stripe 32, as shown in FIG. 8.

Lower sheet 40 has a thickness of 300 μm, is formed of a soft resin (e.g., poly-vinyl chloride added with plasticizer), and has opening 40A in which the lower portion of IC pellet 35 is fitted. Lower sheet 40 is adhered to IC module 33 by an adhesive excluding these portions corresponding to the lower surface of upper sheet 39 and opening 34A of IC module 33.

Upper and lower overcoats 42 and 43 have a thickness of 100 μm, respectively, and are formed of a hard resin (e.g. vinyl chloride). Upper and lower overcoats 42 and 43 respectively cover the upper surfaces of IC module 33 and upper sheet 39 and the lower surfaces of lower sheet 40 and IC pellet 35, and are adhered thereto by an adhesive. Eight small holes in a 2×4 matrix are formed in upper overcoat 42 at positions corresponding to contact portions 36. Magnetic stripe 32 coated with iron oxide powder is formed on upper overcoat 42 to extend along one long side of the card.

Figure 9A:
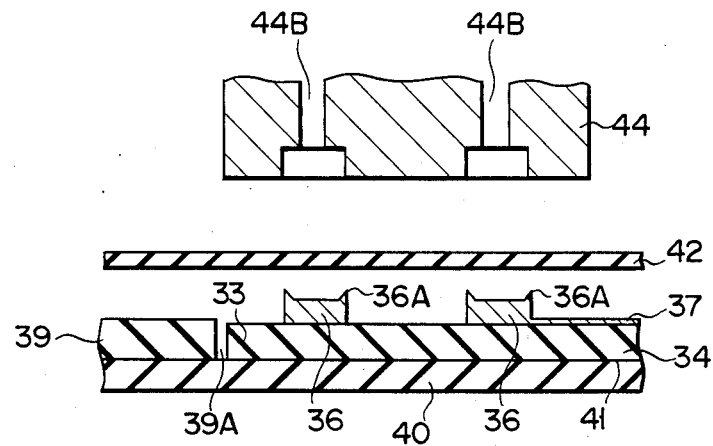
FIGS. 9A and 9B are sectional views showing some of the steps in the manufacture of the card shown in FIG. 7.
Figure 9B:
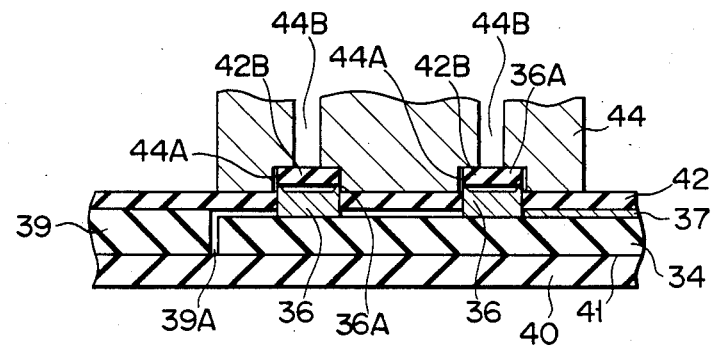

A method of forming small holes 42A in upper overcoat 42 and externally exposing contact portions 36 will now be described with reference to FIGS. 9A and 9B.

Die 44 has recesses 44A suitable for the shape and arrangement of a plurality of contact oortions 36, and recesses 44A communicate with air holes 44B. Each recess 44A has a depth slightly larger than the projecting length of each contact portion 36. Upper overcoat 42 is arranged above contact portions 36 projecting from wiring substrate 34, and die 44 is driven from above so that upper overcoat 42 is sandwiched between die 44 and contact portions 36, which serve as punches. Therefore, upper overcoat 42 is locally cut around the respective contact portions 36, and contact portions 36 are arranged in substantially the same plane as that of upper overcoat 42 to be externally exposed. When upper overcoat 42 is cut, the lower surface thereof is adhered to the upper surfaces of IC module 33 and upper sheet 39 and lower sheet 40 is adhered to IC module 33 and sheet 39, by adhesive 41. Although cut segments 42B of upper overcoat 42 are left in recesses 44A of die 44, they are removed by airflow supplied from air holes 44B.

A method of manufacturing the electronic memory card shown in FIGS. 7 and 8 will now be described. Rolled upper overcoat 42 is arranged above rolled upper sheet 39 in which openings 39A are formed at predetermined intervals. Rolled lower sheet 40, in which openings 40A are formed at predetermined intervals, and rolled lower overcoat 43 are arranged below upper sheet 39 to be aligned with each other. As shown in FIGS. 9A and 9B, upper sheet 39 is overlaid on lower sheet 40 and is adhered thereto by adhesive 41. Thereafter, preformed IC module 33 is fitted in opening 39A of upper sheet 39, and the lower portion of IC pellet 35 is fitted in opening 40A of lower sheet 40. Next, the lower surface of wiring substrate 34 is adhered to the upper surface of lower sheet 40 by an adhesive. Thereafter, using the previously mentioned method, upper overcoat 42 is punched by die 44 and contact portions 36 and, at the same time, upper overcoat 42 is adhered to upper sheet 39 and IC module 33 by adhesive 41. Lower overcoat 43 is then adhered to the lower surfaces of IC module 33 and lower sheet 40 by an adhesive. Finally, the outer periphery of the resultant structure is cut to a predetermined size, and magnetic stripe 32 is formed on upper overcoat 42, thus completing manufacture of an electronic memory card.

According to the embodiment of the present invention, openings 39A and 40A are respectively preformed in upper and lower sheets 39 and 40, and wiring substrate 34 and the lower portion of IC pellet 35 are respectively fitted therein, thus allowing easy alignment of IC module 33 and IC pellet 35. Therefore, electronic memory cards can be efficiently manufactured. Sharp edge portion 36A is formed on each contact portion 36, and small holes are formed in upper overcoat 42 using die 44 and contact portions 36, which serve as punches. During the formation of the small holes, upper overcoat 42 is adhered to upper sheet 39 and IC module 33. Therefore, the cost and the number of steps in the manufacture of the electronic memory card can be greatly reduced. In addition, since the electronic memory card has magnetic stripe 32, it can be used as a magnetic card.

What is claimed is:

1. An electronic apparatus, comprising:
   an integrated circuit pellet which includes:
   a substrate having a surface in which at least one semiconductor element is formed;
   a two-pad layered structure on said at least one semiconductor element, said two-pad layered structure comprising:
   a first insulating layer formed on said substrate over said at least one semiconductor element and having a plurality of through holes therein;

a plurality of first electrode pads at least partly disposed in said through holes of said first insulating layer;

a second insulating layer on said first electrode pads; and a plurality of second electrode pads formed on said second insulating layer and being electrically connected to said first electrode pads each of said second electrode pads having an area larger than that of any of said first electrode pads;

carrier means for carrying said integrated circuit pellet, said carrier means including an insulating substrate and a plurality of conductive leads formed on said insulating substrate; and connecting means for electrically connecting said second electrode pads to said conductive leads respectively.

2. The electronic apparatus according to claim 1, further comprising an anisotropic adhesive interposed between said integrated circuit pellet and said carrier means to bond them together.

3. The electronic apparatus according to claim 1, wherein:

said connecting means includes internal connection terminals for electrically connecting said second electrode pads to said conductive leads of said carrier means;

said carrier means including external connection terminals;

said carrier means further including insulating means which covers a portion facing said integrated circuit pellet and said conductive leads; and said external connection terminals are electrically connected to external contact terminals, respectively, inserted in said insulating means.

4. The electronic apparatus according to claim 3, wherein said external contact terminals are urged to be inserted in said insulating means from outside of said insulating means.

5. The electronic apparatus according to claim 3, wherein said external contact terminals are mounted on respective conductive leads and are urged to be inserted in said insulating means.

* * * * *